(12) United States Patent
Wang

(10) Patent No.: US 8,241,473 B2
(45) Date of Patent: Aug. 14, 2012

(54) SPUTTER-COATING APPARATUS

(75) Inventor: Chung-Pei Wang, Tucheng (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 323 days.

(21) Appl. No.: 12/728,259

(22) Filed: Mar. 21, 2010

(65) Prior Publication Data

US 2011/0062021 A1 Mar. 17, 2011

(51) Int. Cl.
*C23C 14/34* (2006.01)
(52) U.S. Cl. ......... 204/298.15; 204/298.23; 204/298.27; 204/298.28; 204/298.29
(58) Field of Classification Search ............ 204/298.15, 204/298.23, 298.27, 298.28, 298.29, 298.41; 118/729, 730
See application file for complete search history.

(56) References Cited

U.S. PATENT DOCUMENTS

| | | | | |
|---|---|---|---|---|
| 4,034,704 A | * | 7/1977 | Wossner et al. | 118/730 |
| 5,370,737 A | * | 12/1994 | Mathis | 118/723 E |
| 2010/0213053 A1 | * | 8/2010 | Wang | 204/298.12 |

* cited by examiner

*Primary Examiner* — Rodney McDonald
(74) *Attorney, Agent, or Firm* — Altis Law Group, Inc.

(57) ABSTRACT

A sputter-coating apparatus for coating a plurality of workpieces includes a deposition case defining a cavity, a supporting assembly received in the cavity, and a target assembly received in the cavity and extending through the supporting assembly to face the workpieces. The supporting assembly includes a plurality of supporting members. Each supporting member includes a body and a plurality of adjusting units extending through the body. Each adjusting unit includes a supporting pole fixed to the body, a first fixing pole and a second fixing pole fixedly connected to the supporting pole and radially extending from the supporting pole, a first threaded pole and a second threaded pole retractably connected to the supporting pole and radially extending from the supporting pole, and a driving member received in the supporting pole for driving the first threaded pole and the second threaded pole to retract relative to the supporting pole.

13 Claims, 5 Drawing Sheets

SPUTTER-COATING APPARATUS

BACKGROUND

1. Technical Field

The present disclosure relates to coating technologies and, particularly, to a sputter-coating apparatus.

2. Description of Related Art

Generally, during sputter-coating a plurality of workpieces, such as cell phone housings, an inert gas is excited in a sputter-coating chamber to release energized ions. The energized ions bombard a solid target material to vaporize the material. The vaporized material is then deposited on the workpieces.

In the sputter-coating chamber, the cell phone housings are supported by a plurality of supporting members, respectively. However, the supporting members have a predetermined size for corresponding cell phone housings. Once the supporting members have been made, they cannot be adjusted for use with cell phone housings of other different sizes. Therefore, this thereby increases cost of manufacturing.

Therefore, what is needed is a sputter-coating apparatus which can overcome the limitations described above.

BRIEF DESCRIPTION OF THE DRAWINGS

Many aspects of the present sputter-coating apparatus can be better understood with reference to the following drawings. The components in the drawings are not necessarily to scale, the emphasis instead being placed upon clearly illustrating the principles of the sputter-coating apparatus. Moreover, in the drawings, like reference numerals designate corresponding parts throughout the several views.

DETAILED DESCRIPTION

Figure 1:
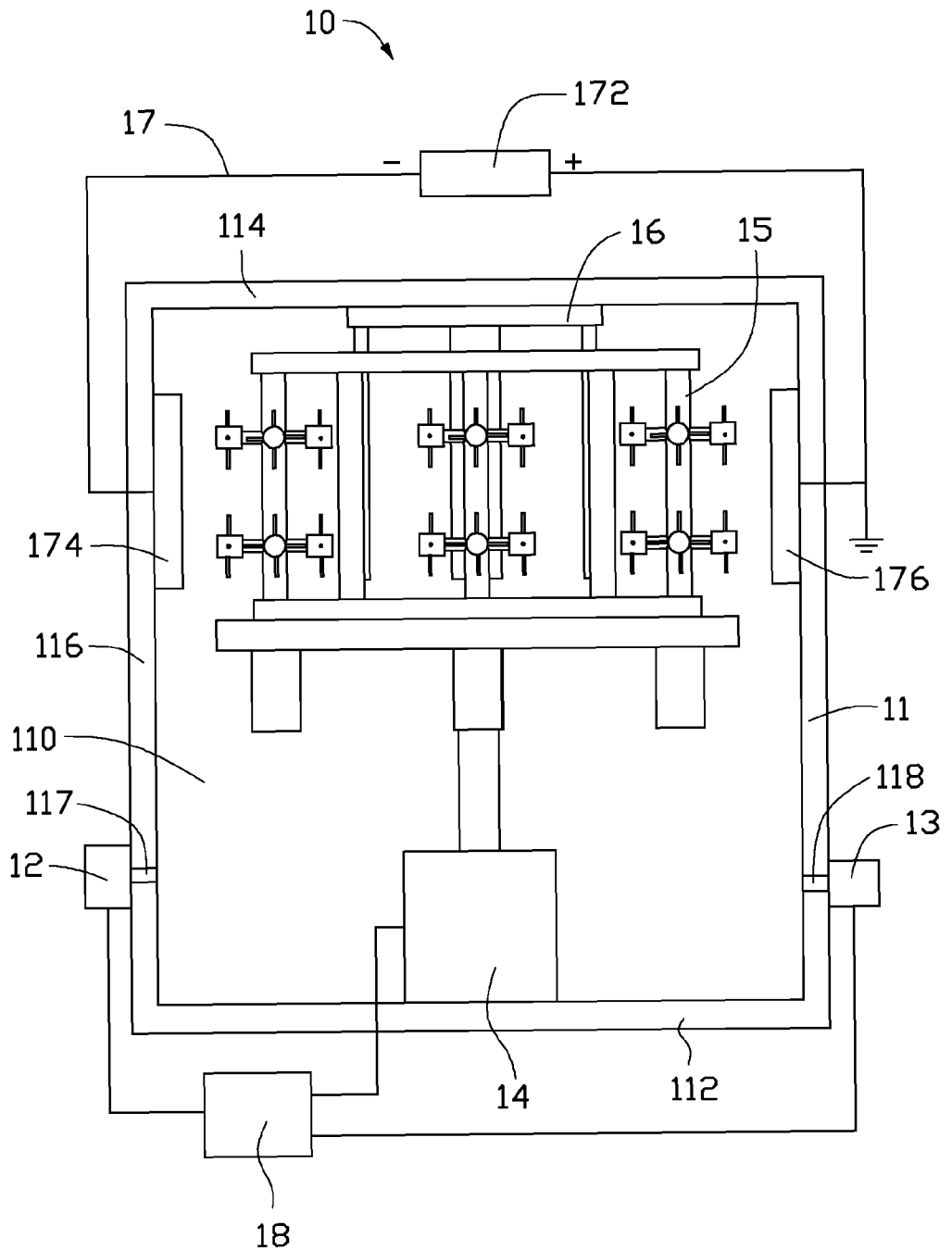
FIG. 1 is a schematic view of a sputter-coating apparatus including a supporting assembly, according to an exemplary embodiment.

Referring to FIG. 1, a sputter-coating apparatus 10 for forming coatings on a plurality of workpieces (not shown), according to an exemplary embodiment, includes a deposition case 11, a vacuum pump 12, an air supplying unit 13, a rotating assembly 14, a supporting assembly 15, a target assembly 16, a power supplying unit 17, and a controller 18.

The deposition case 11 may be made of metal, and defines a cavity 110. The deposition case 11 is a hollow cylinder and includes a bottom panel 112, a top panel 114 opposite to the bottom panel 112, and a cylindrical sidewall 116 connecting the bottom panel 112 to the top panel 114. A gas outlet 117 and a gas inlet 118 are defined in the sidewall 116.

The vacuum pump 12 is connected to the gas outlet 117 for evacuating the deposition case 11. The air supplying unit 13 is connected to the gas inlet 118 for introducing an inert gas into the cavity 110. The inert gas may be argon or xenon.

Figure 2:
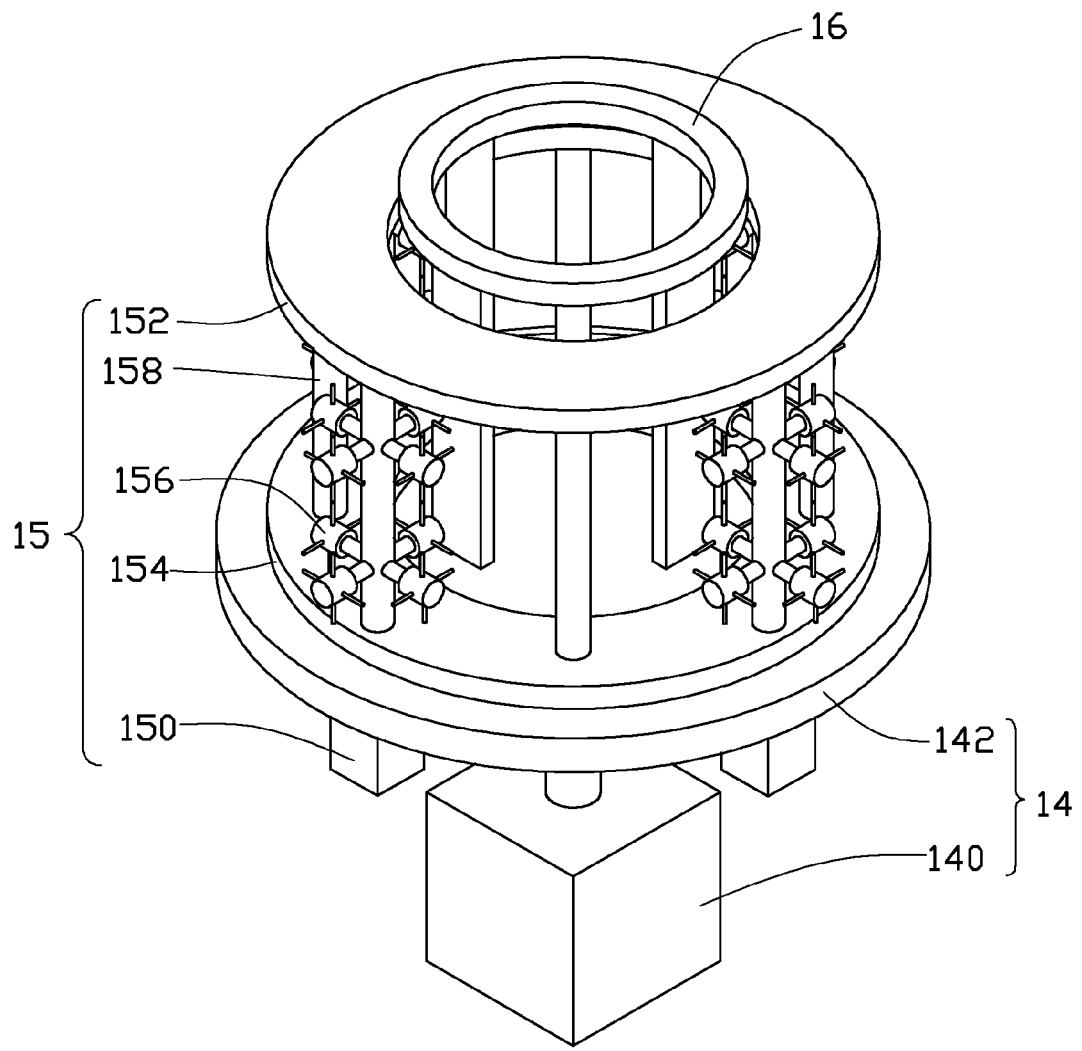
FIG. 2 is a partial, isometric view of the sputter-coating apparatus of FIG. 1.
Figure 3:
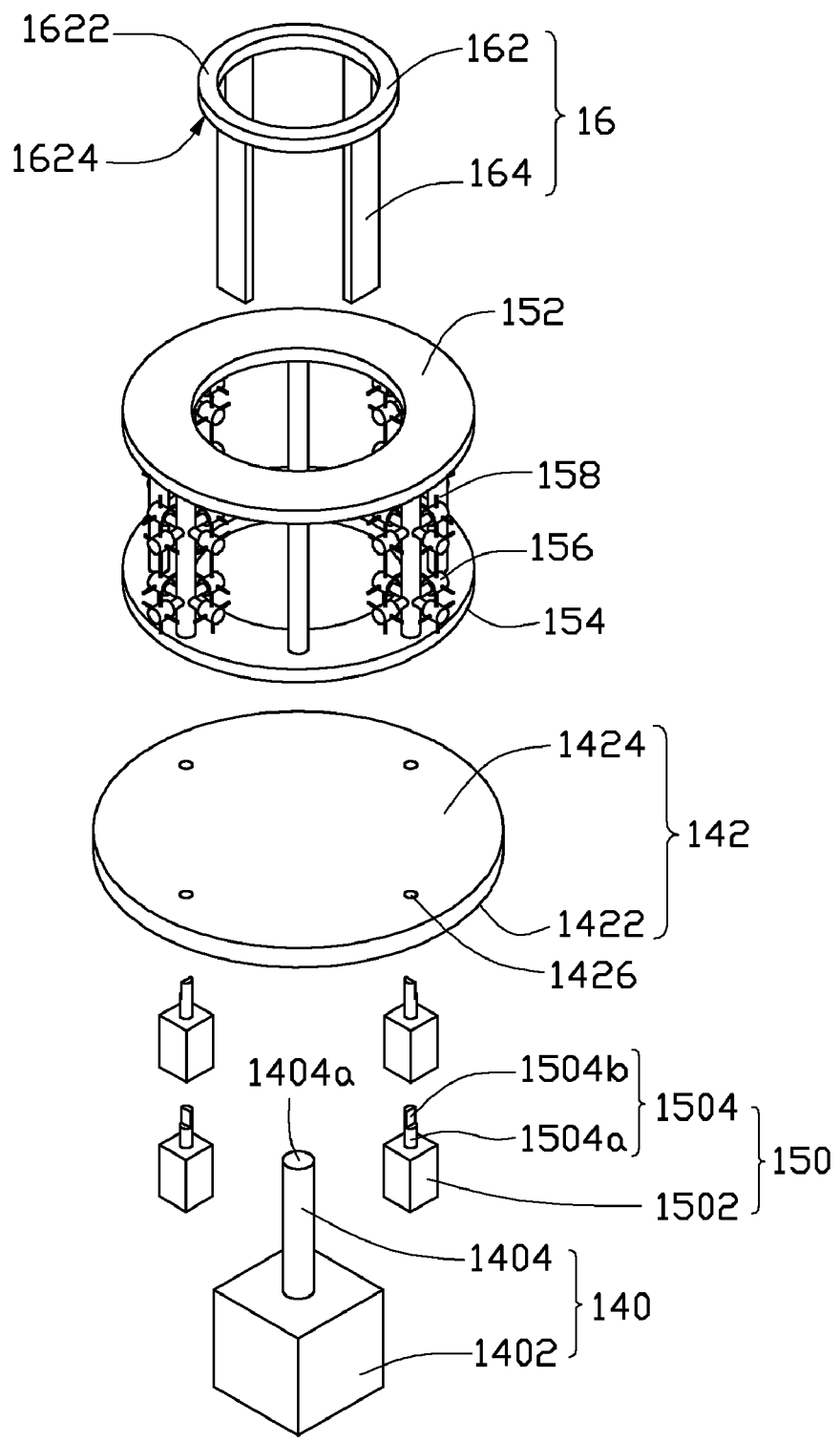
FIG. 3 is a partial, exploded view of the sputter-coating apparatus of FIG. 1.

Referring to FIGS. 2 and 3, the rotating assembly 14 is fixed to the bottom panel 112 in the cavity 110. The rotating assembly 14 includes a first actuator 140 and a base 142 fixed to the first actuator 140.

The first actuator 140 is a servomotor. The first actuator 140 includes a first stator 1402 and a first rotor 1404 extending from the first stator 1402.

The base 142 is disc-shaped. The base 142 includes a first surface 1422 and a second surface 1424 at opposite sides of the base 142. Four first through holes 1426 are defined in the base 142. A distal end 1404a of the first rotor 1404 is fixed to the first surface 1422 by adhesive so that the base 142 is fixed to the actuator 140. It is to be understood that the first rotor 1404 can be screwed to the base 142 if a threaded hole (not shown) is defined in the first surface 1422 and a plurality of threads (not shown) corresponding to the threaded hole are defined in the distal end 1404a of the rotor 1404.

Figure 4:
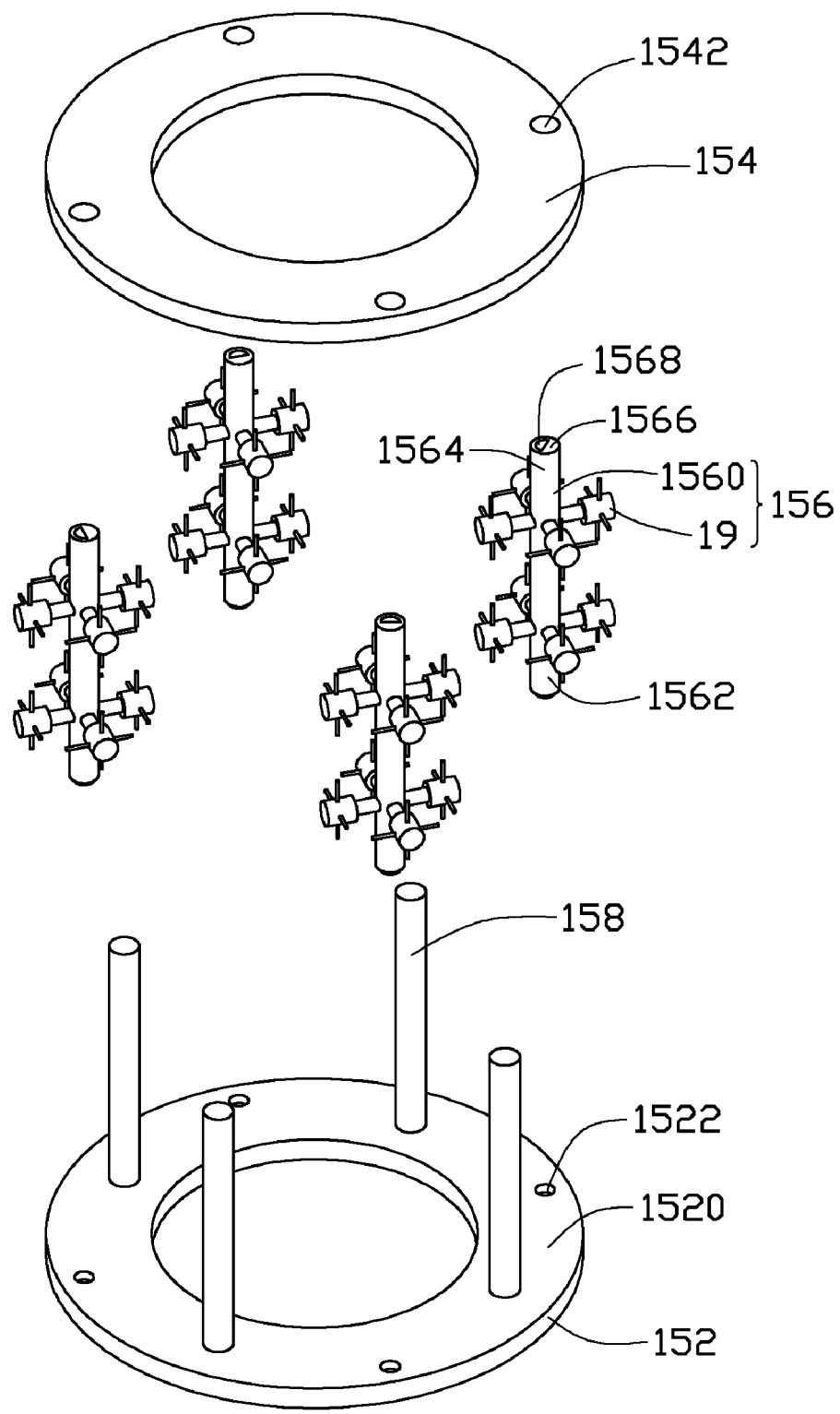
FIG. 4 is an exploded view of the supporting assembly of the sputter-coating apparatus of FIG. 1.

Referring to FIGS. 2-4, the supporting assembly 15 is fixed on the second surface 1424 of the base 142. The supporting assembly 15 includes four second actuators 150, an upper fixing member 152, a lower fixing member 154, four supporting members 156, and four connecting poles 158. The upper fixing member 152 is opposite to the lower fixing member 154. The four supporting members 156 are configured for supporting the workpieces. The four connecting poles 158 connect the upper fixing member 152 to the lower fixing member 154.

Each second actuator 150 is a servomotor. Each second actuator 150 includes a second stator 1502 and a second rotor 1504 extending from the second stator 1502. The second rotor 1504 includes a cylindrical portion 1504a and a half-cylinder portion 1504b extending from the cylindrical portion 1504a.

The upper fixing member 152 is an annular plate and includes a third surface 1520 facing the lower fixing member 154. Four bearing holes 1522 are defined in the third surface 1520. The lower fixing member 154 is an annular plate and defines four second through holes 1542 each corresponding to the first through hole 1426.

The supporting members 156 are positioned between the upper fixing member 152 and the second fixing member 154. The supporting members 156 are apart from each other at equidistance. Each supporting members 156 includes a cylindrical body 1560 and eight adjusting units 19.

Each body 1560 includes a first end 1562 and a second end 1564 at opposite ends of the body 1560. Each first end 1562 is fixed to the corresponding bearing hole 1522. An engaging hole 1568 is defined in an end surface of each second end 1564 corresponding to the half-cylinder portion 1504b. The second actuators 150, the first through holes 1426, the second through holes 1542, and the engaging holes 1568 correspond to each other. The second stators 1502 are fixed to the first surface 1422 by glue. The cylindrical portion 1504a and the half-cylinder portion 1504b extend through the corresponding first through hole 1426 and the corresponding second through hole 1542. The half-cylinder portion 1504b is engaged with the corresponding engaging hole 1568. Therefore, each supporting member 156 is connected to the corresponding second actuator 1504.

Every four adjusting units 19 radially extend from a circumference of the body 1560. Every two adjusting units 19 are equidistantly spaced from each other and arranged in rows along a lengthwise direction of the body 1560 so that four rows of adjusting units 19 are formed in each body 1560 along the lengthwise direction of the body 1560.

Figure 5:
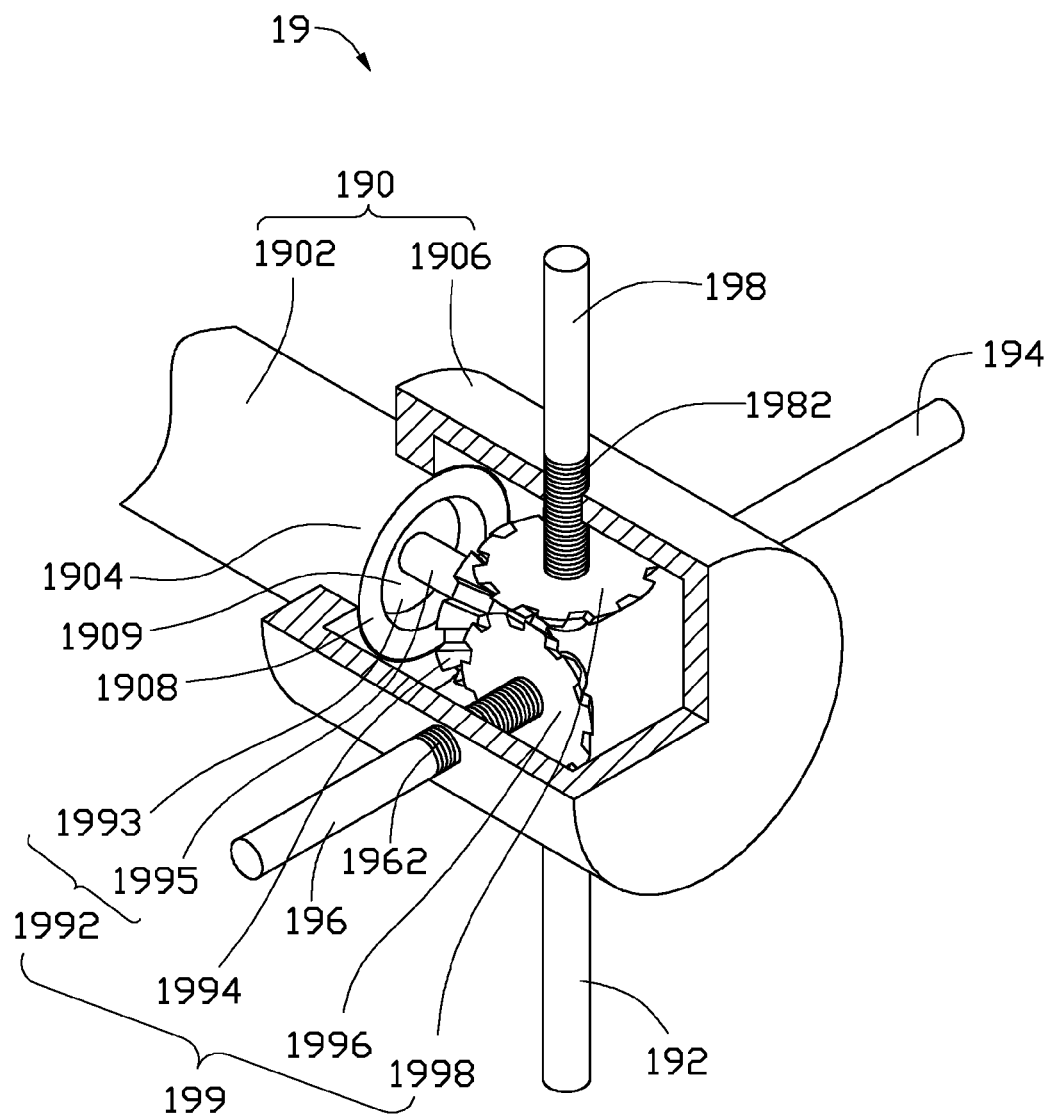
FIG. 5 is a cutaway view of an adjusting member of the sputter-coating apparatus of FIG. 1.

Referring to FIG. 5, each adjusting unit 19 includes a supporting pole 190, a first fixing pole 192, a second fixing pole 194, a first threaded pole 196, a second threaded pole 198, and a driving member 199 received in the supporting pole 190.

The supporting pole 190 includes an arm 1902 and a sleeve 1906. The arm 1902 radially extends from a circumference of the body 1560. The sleeve 1906 is sleeved on a distal end 1904 of the arm 1902. A receiving hole 1909 is defined in an end surface of the distal end 1904.

The first fixing pole 192 and the second fixing pole 194 are fixedly connected to the sleeve 1906 and radially extend from a circumference of the sleeve 1906. The first threaded pole 196 and the second threaded pole 198 are retractably connected to the sleeve 1906 and radially extend from a circumference of the sleeve 1906. A first external thread 1962 is formed on the first threaded pole 196. A second external thread 1982 is formed on the second threaded pole 198. The first fixing pole 192 is coaxial with the second threaded pole 198. The first fixing pole 192 and the second threaded pole 198 are substantially parallel to the body 1560. The second fixing pole 194 is coaxial with the first threaded pole 196. The second fixing pole 194 and the first threaded pole 196 are substantially spatially perpendicular to the body 1560. In this embodiment, the first fixing pole 192 and the second fixing pole 194 are fixedly connected to the sleeve 1906 by glue.

The driving member 199 includes a third actuator 1992, a driving gear 1994, a first follower gear 1996, and a second follower gear 1998.

The third actuator 1992 is a servomotor. The third actuator 1992 includes a third stator 1993 and a third rotor 1995 extending from the third stator 1993. The third stator 1993 is received in the receiving hole 1909. The third rotor 1995 extends from the receiving hole 1909.

The driving gear 1994 is fixedly connected to the third rotor 1995 of the third actuator 1992. The first follower gear 1996 and the second follower gear 1998 are rotatably received in the sleeve 1906 through a bearing (not shown). The first follower gear 1996 is screwed to the first threaded pole 196. The second follower gear 1998 is screwed to the second threaded pole 198. The driving gear 1994 is engaged with the first follower gear 1996 and the second follower gear 1998 to drive the first follower gear 1996 and the second follower gear 1998 to rotate simultaneously. The first follower gear 1996 and the second follower gear 1998 are rotatably received in the sleeve 1906.

The first follower gear 1996 and the second follower gear 1998 can rotate with the rotation of the driving gear 1994 but cannot move along the central axes of the first threaded pole 196 and the second threaded pole 198 respectively. In this embodiment, the driving gear 1994, the first follower gear 1996, and the second follower gear 1998 are bevel gears.

Referring to FIGS. 1 and 3, the target assembly 16 includes an annular plate 162 and four targets 164 fixed to the plate 162. The plate 162 includes an upper surface 1622 and a lower surface 1624 at opposite sides of the plate 162. The upper surface 1622 is fixed to the top panel 114 by glue. The four targets 164 are fixed to the lower surface 1624 and are extended through the upper fixing member 152 to face the workpieces supported by the four supporting members 156.

The power supplying unit 17 includes a power source 172, a cathode 174, and an anode 176. The power source 172 may be positioned outside the deposition case 11. The cathode 174 and the anode 176 are received in the deposition case 11 and fixed to the sidewall 116. The supporting assembly 15 is positioned between the cathode 174 and the anode 176. The power source 172 is electrically connected to the cathode 174 and the anode 176.

The controller 18 is electrically connected to the vacuum pump 12, the air supplying unit 13, the first actuator 140, the second actuator 150, and the third actuator 1992. The controller 18 is configured for the following: controlling the vacuum pump 12 to evacuate the deposition case 11, controlling the air supplying unit 13 to introduce the inert gas into the cavity 110, controlling the first actuator 140 to drive the first rotor 1404 to rotate, controlling the second actuator 150 to drive the second rotor 1504 to rotate, and controlling the third actuator 1992 to drive the third rotor 1995 to rotate.

When in assembly, the first fixing pole 192, the second fixing pole 194, the first threaded pole 196, and the second threaded pole 198 abut four sidewalls of a workpiece cooperatively, respectively, so that the workpiece is mounted to the supporting member 156. Once other workpieces having a different size are needed to be coated, the controller 18 controls the third actuator 1992 to drive the third rotor 1995 to rotate. Thus, the driving gear 1994 rotates with the rotation of the third rotor 1995. The first follower gear 1996 is driven to rotate by means of the engagement of the first follower gear 1996 and the driving gear 1994. The first threaded pole 196 is driven to rotate accordingly, and for example, is extended away from the sleeve 1906. The second follower gear 1998 is driven to rotate by means of the engagement of the second follower gear 1998 and the driving gear 1994. The second threaded pole 198 is driven to rotate accordingly, and for example, is extended away from the sleeve 1906. Therefore, the supporting members 156 can support workpieces of other different sizes.

When the workpieces have been supported and held in place, the inert gas is excited to release energized ions. The energized ions bombard the four targets 164 to vaporize the targets 164. The base 142 rotates with the rotation of the first rotor 1404. The supporting members 156 rotate with the rotation of the second rotor 1504. As a result, the vaporized target can be coated on the workpieces uniformly.

It is to be understood, however, that even though numerous characteristics and advantages of the present embodiments have been set fourth in the foregoing description, together with details of the structures and functions of the embodiments, the disclosure is illustrative only, and changes may be made in details, especially in matters of shape, size, and arrangement of parts within the principles of the invention to the full extent indicated by the broad general meaning of the terms in which the appended claims are expressed.

What is claimed is:

1. A sputter-coating apparatus for coating a plurality of workpieces, comprising:
    a deposition case defining a cavity;
    a supporting assembly received in the cavity, the supporting assembly comprising a plurality of supporting members configured for supporting the plurality of workpieces; and
    a target assembly received in the cavity and extending through the supporting assembly to face the workpieces;
    wherein each supporting member comprises a body and a plurality of adjusting units extending through the body, each adjusting unit comprising:
        a supporting pole fixed to the body;
        a first fixing pole and a second fixing pole fixedly connected to the supporting pole and radially extending from the supporting pole;
        a first threaded pole and a second threaded pole retractably connected to the supporting pole and radially extending from the supporting pole; and
        a driving member received in the supporting pole for driving the first threaded pole and the second threaded pole to retract relative to the supporting pole, the first fixing pole, the second fixing pole, the first threaded pole, and the second threaded pole cooperatively supporting the workpieces.

2. The sputter-coating apparatus as claimed in claim 1, wherein the deposition case comprises a bottom panel, a top panel opposite to the bottom panel, and a cylindrical sidewall connecting the bottom panel to the top panel, and a gas outlet and a gas inlet are defined in the sidewall.

3. The sputter-coating apparatus as claimed in claim 2, wherein the sputter-coating apparatus further comprises a vacuum pump and an air supplying unit, the vacuum pump is connected to the gas outlet for evacuating the deposition case, the air supplying unit is connected to the gas inlet for introducing an inert gas into the cavity.

4. The sputter-coating apparatus as claimed in claim 3, wherein the sputter-coating apparatus further comprises a power supplying unit, the power supplying unit comprises a power source, a cathode and an anode; the power source is positioned outside of the deposition case; the cathode and the anode are received in the cavity and fixed to the sidewall of the deposition case; the power source is electrically connected to the cathode and the anode; the supporting assembly is between the cathode and the anode.

5. The sputter-coating apparatus as claimed in claim 4, wherein the sputter-coating apparatus further comprises a rotating assembly positioned between the cathode and the anode, the supporting assembly is positioned on the rotating assembly.

6. The sputter-coating apparatus as claimed in claim 5, wherein the rotating assembly comprises a first actuator and a base, the first actuator comprises a first stator and a first rotor extending from the stator, the base is fixed to the first rotor and configured for rotating with the rotation of the first rotor.

7. The sputter-coating apparatus as claimed in claim 6, wherein the base comprises a first surface fixed to the first rotor and a second surface opposite to the first surface, a plurality of first through holes are defined in the base; the supporting assembly further comprises an upper fixing member, a lower fixing member opposite to the upper fixing member, a plurality of second actuators corresponding to the supporting members, and a plurality of connecting poles connecting the upper fixing member to the lower fixing member; a plurality of bearing holes are defined on a surface of the upper fixing member facing the lower fixing member, a plurality of second through holes are defined in the lower fixing member; each second actuator comprises a second stator and a second rotor extending from the second stator; the bearing holes and the second through holes correspond to the supporting members and the second actuators, each body comprises a first end and a second end opposite to the first end, each first end is fixed to the bearing hole, each second rotor extends through corresponding first through hole and second through hole to connect each second end.

8. The sputter-coating apparatus as claimed in claim 7, wherein the second rotor includes a cylindrical portion and a half-cylinder portion extending from the cylindrical portion, each second end defines an engaging holes corresponding to the half-cylinder portion of each second rotor, the cylindrical portion of each second rotor extends through the corresponding first through hole and the corresponding second through hole, and the half-cylinder portion of each second rotor engages with the corresponding engaging hole.

9. The sputter-coating apparatus as claimed in claim 7, wherein the target assembly comprises an annular plate and a plurality of targets fixed to the plate; the plate is fixed to the top panel, and the targets are extended through the upper fixing member to face the workpieces supported by the supporting member.

10. The sputter-coating apparatus as claimed in claim 9, wherein the body is a cylinder, every four adjusting units radially extend from a circumference of the body, every two adjusting units are equidistantly spaced from each other and arranged in rows along a lengthwise direction of the body.

11. The sputter-coating apparatus as claimed in claim 10, wherein each supporting pole comprises an arm and a sleeve, the arm radially extends from a circumference of the body, the sleeve is sleeved on a distal end of the arm, and a receiving hole is defined in an end surface of the distal end; the driving member comprises a third actuator, a driving gear, a first follower gear screwed to the first threaded pole, and a second follower gear screwed to the second threaded pole, the third actuator comprises a third stator received in the receiving hole and a third rotor extending from the third stator out of the receiving hole, the driving gear is connected to the third rotor and engaged with the first follower gear and the second follower gear, and the first follower gear and the second follower gear are connected to the sleeve through a bearing.

12. The sputter-coating apparatus as claimed in claim 11, wherein the driving gear, the first follower gear, and the second follower gear are bevel gears.

13. The sputter-coating apparatus as claimed in claim 11, wherein the sputter-coating apparatus further comprises a controller, the controller is electrically connected to the vacuum pump, the air supplying unit, the first actuator, the second actuator, and the third actuator; the controller is configured for controlling the vacuum pump to evacuate the deposition case, controlling the supply unit to introduce the inert gas into the cavity, controlling the first actuator to drive the first rotor to rotate, controlling the second actuator to drive the second rotor to rotate, and controlling the third actuator to drive the third rotor to rotate.

* * * * *